(12) United States Patent
Park et al.

(10) Patent No.: US 6,855,960 B2
(45) Date of Patent: Feb. 15, 2005

(54) FLAT PANEL DISPLAY WITH BLACK MATRIX AND METHOD OF FABRICATING THEREOF

(75) Inventors: Sang-Il Park, Seoul (KR); Dong-Chan Shin, Hwaseong-gun (KR); Hye-Dong Kim, Seongnam (KR); Chang-Su Kim, Suwon (KR)

(73) Assignee: Samsung SDI Co., Ltd., Suwon-Si (KR)

( * ) Notice: Subject to any disclaimer, the term of this patent is extended or adjusted under 35 U.S.C. 154(b) by 0 days.

(21) Appl. No.: 10/354,110

(22) Filed: Jan. 30, 2003

(65) Prior Publication Data

US 2003/0193284 A1 Oct. 16, 2003

(30) Foreign Application Priority Data

Apr. 15, 2002 (KR) ........................................ 2002-20426

(51) Int. Cl.[7] .............................................. H01L 33/00
(52) U.S. Cl. .......................... 257/98; 257/191; 257/437
(58) Field of Search ........................ 438/29–32, 69–72, 438/149–161; 257/185–192, 98, 431–437

(56) References Cited

U.S. PATENT DOCUMENTS

2003/0107326 A1 * 6/2003 Park et al. ................ 315/169.3
2003/0117059 A1 * 6/2003 Koo et al. ................... 313/422

* cited by examiner

Primary Examiner—Caridad Everhart
Assistant Examiner—Calvin Lee
(74) Attorney, Agent, or Firm—Stein, McEwen & Bui, LLP

(57) ABSTRACT

An organic electroluminescent display in which a black matrix with a concentration gradient of a transparent material and a metallic material is formed on the same surface as a pixel electrode. The black matrix and a pixel electrode of the organic electroluminescent display are formed using only one masking operation. The black matrix has a concentration gradient of a continuous gradient structure in which constituents of the transparent material are continuously decreased while constituents of the metallic material are continuously increased as a thickness of the black matrix is increased, a step gradient structure in which the constituents of the transparent material are gradually decreased while the constituents of the metallic material are gradually increased as the thickness of the black matrix is increased, or a multi-gradient structure in which the continuous gradient structure and/or the step gradient structure are repeated.

11 Claims, 4 Drawing Sheets

FLAT PANEL DISPLAY WITH BLACK MATRIX AND METHOD OF FABRICATING THEREOF

CROSS-REFERENCE TO RELATED APPLICATIONS

This application claims the benefit of Korean Patent Application No. 2002-20426 filed on Apr. 15, 2002, in the Korean Intellectual Property Office, the disclosure of which is incorporated herein by reference.

BACKGROUND OF THE INVENTION

1. Field of the Invention

The present invention relates to a flat panel display, and more particularly, to an organic electroluminescent display in which a pixel electrode and a black matrix with a concentration gradient of a transparent material and a metallic material are formed on the same surface of a substrate, and a method of fabricating thereof without an additional masking operation.

2. Description of the Related Art

FIG. 1 illustrates a cross-sectional view of a conventional active matrix organic electroluminescent display.

Referring to FIG. 1, a thin film transistor (TFT) and a capacitor are formed on a first region 101 of a dielectric substrate 100, on an upper part of which a buffer layer 110 is formed. The thin film transistor is equipped with source/drain regions 125 and 126 which are formed on a semiconductor layer 120, a gate electrode 131 which is formed on a gate insulating layer 130, and source/drain electrodes 151 and 152 which are formed on an interlayer insulating layer 140 so as to be electrically connected to the source/drain regions 125 and 126, respectively, through contact holes 141 and 142.

The capacitor is equipped with a first electrode 135 formed on the gate insulating layer 130 and a second electrode 155 connected to the source electrode 151. A part interposed between the first and second electrodes 135 and 155 in the interlayer insulating layer 140 functions as a dielectric layer of the capacitor.

An organic electroluminescent display device is formed on the second region 102 of the dielectric substrate 100. The organic electroluminescent display device is equipped with a pixel electrode 170 which is formed on a passivation layer 160 so as to be electrically connected to the drain electrode 152 through a via hole 161, an organic electroluminescent layer 190 which is formed on the pixel electrode 170 exposed through an opening part 185, and a metal electrode 195 which is formed on a planarization layer 180 comprising the organic electroluminescent layer 190.

A flat panel display such as an active matrix organic light emitting device (AMOLED) with the foregoing structure includes a switching device and various wirings to impress power supply to the switching device, wherein an external light is reflected by a metallic material of the wirings.

For example, contrast is greatly deteriorated since the external light is reflected by a metallic material which is used to form a gate electrode and a lower electrode of the capacitor, an electrode material which is used to form source/drain electrodes and an upper electrode of the capacitor, and an electrode material which is used to form a cathode.

To prevent the deterioration of contrast due to a reflection of external light, an expensive polarizer has been adhered to a front surface of a conventional organic electroluminescent display. However, in addition to an increase in manufacturing cost due to the use of the polarizer, transmittancy of the display is deteriorated. That is, since the polarizer itself blocks light emitted from an organic electroluminescent layer of the display, luminance is also decreased.

Furthermore, in a conventional display, a black matrix comprising $Cr/CrO_x$ or an organic layer is separately formed on a region where a thin film transistor and a capacitor are formed. However, a conventional fabrication method thereof is complex and problematic as the method necessarily requires a separate masking operation to form the black matrix.

SUMMARY OF THE INVENTION

Accordingly, an aspect of the present invention is to provide a flat panel display having a pixel electrode and a black matrix in which the black matrix and the pixel electrode are simultaneously formed on the same surface, and a fabrication method thereof.

Another aspect of the present invention is to provide a flat panel display having a black matrix which is capable of preventing a deterioration of contrast and improves luminance by preventing a reflection due to external light, and a fabrication method thereof without an additional masking operation.

Additional aspects and advantages of the invention will be set forth in part in the description which follows and, in part, will be obvious from the description, or may be learned by practice of the invention.

To achieve the above and/or other aspects of the present invention, there is provided a method of fabricating a flat panel display, the method comprising sequentially forming a pixel electrode material and a black matrix material on a dielectric substrate, simultaneously forming a pixel electrode and a black matrix on the substrate by patterning the pixel electrode material and the black matrix material, forming a first insulating layer on a front surface of the substrate, forming a thin film transistor connected to the pixel electrode and a capacitor connected to the thin film transistor on the first insulating layer corresponding to the black matrix, forming a second insulating layer on the front surface of the substrate, and forming an opening part exposing a part of the pixel electrode by etching the first and second layers.

The black matrix material may comprise a transparent dielectric material such as $SiO_2$ and $SiN_x$ and a metallic material, or a transparent conductive material such as ITO, IZO, and ZnO and a metallic material. The black matrix material may have a concentration gradient of a continuous gradient structure in which constituents of the transparent material are continuously decreased while constituents of the metallic material are continuously increased as a thickness of the black matrix is being increased, a step gradient structure in which the constituents of the transparent material are gradually decreased while the constituents of the metallic material are gradually increased as the thickness of the black matrix is being increased, or a multi-gradient structure in which the continuous gradient structure and/or the step gradient are repeated.

To achieve the above and/or other aspects of the present invention, there is provided a flat panel display comprising a dielectric substrate, a pixel electrode formed on the dielectric substrate, a black matrix formed on the same surface as the pixel electrode, a first insulating layer formed on a front surface of the dielectric substrate, a thin film transistor formed on the first insulating layer corresponding to the black matrix so as to be connected to the pixel electrode, a capacitor formed on the first insulating layer corresponding to the black matrix so as to be connected to the thin film transistor, and a second insulating layer formed on the front surface of the dielectric substrate having an opening part which exposes a part of the pixel electrode.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
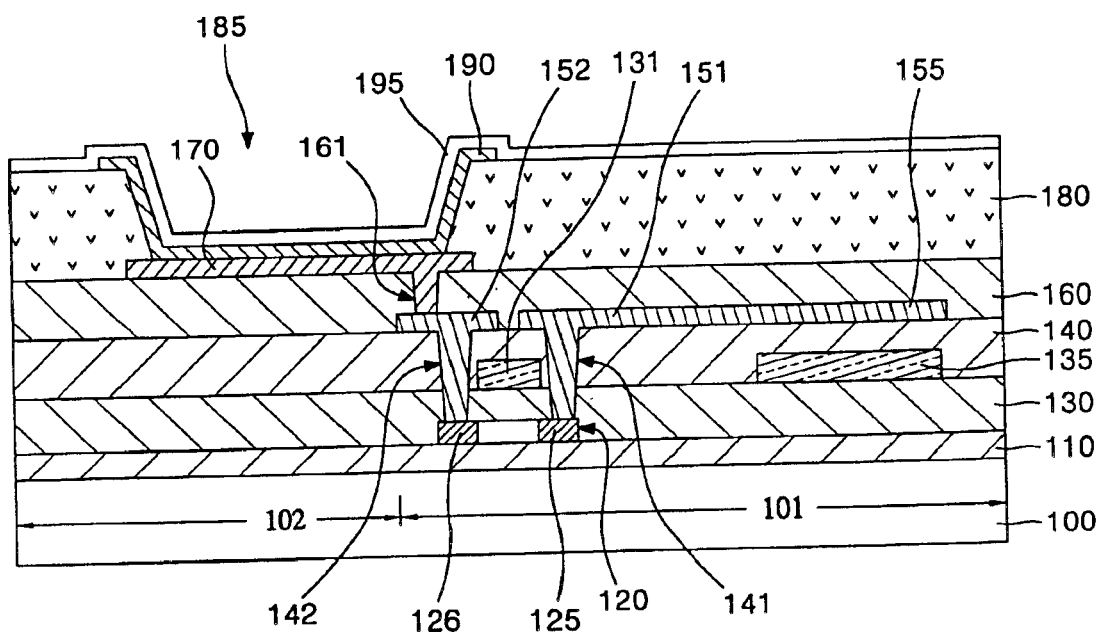
FIG. 1 is a cross-sectional view of a conventional organic electroluminescent display.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 2A to FIG. 2E show cross-sectional views illustrating a method of fabricating an organic electroluminescent display according to an embodiment of the present invention.

Figure 2A:
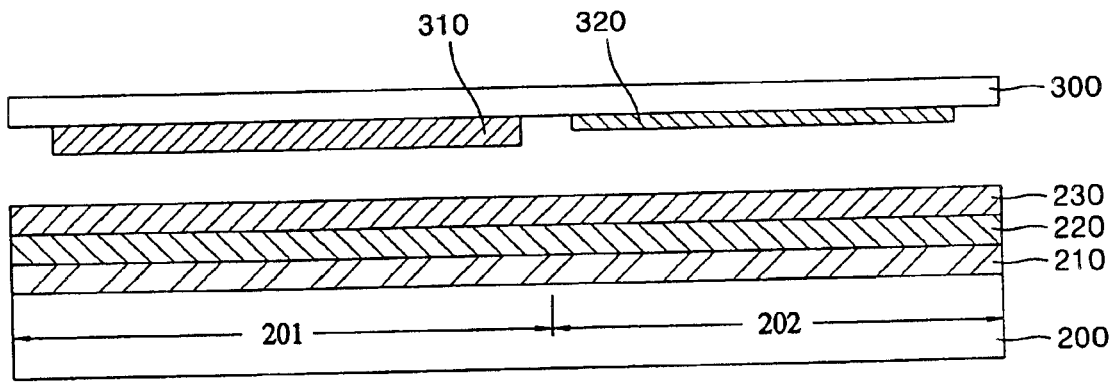
FIG. 2A to FIG. 2E are cross-sectional views illustrating a method of fabricating an organic electroluminescent display according to an embodiment of the present invention.

Referring to FIG. 2A, a transparent conductive layer 210 for a pixel electrode and a layer having a concentration gradient for a black matrix are sequentially deposited on a transparent dielectric substrate 200, equipped with a first region 201 on which a thin film transistor and a capacitor are to be formed and a second region 202 on which an organic electroluminescent display device is to be formed. A photosensitive layer 230 is coated on the layer having a concentration gradient for the black matrix.

Subsequently, parts on which the black matrix and the pixel electrode are to be formed are defined using a halftone mask 300, wherein the halftone mask 300 is equipped with a blocking region 310 which completely blocks light to limit a part on which the black matrix is to be formed, and a semi-transmission region 320 which transmits only a part of the light to limit a part on which the pixel electrode is to be formed. The residual part except for the blocking region 310 and the semi-transmission region 320 is a transmission region which transmits all of the light.

Figure 2B:
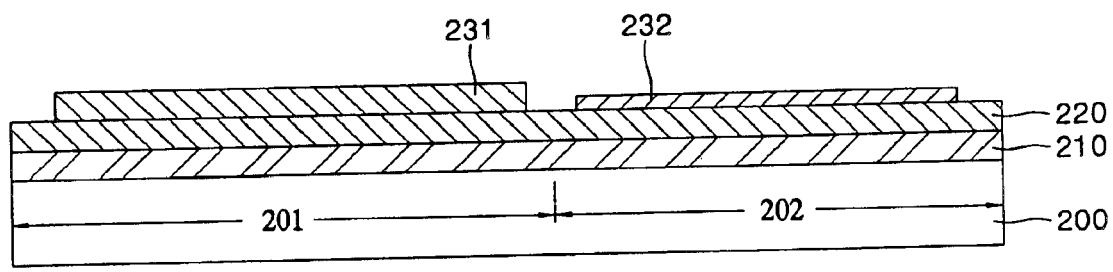

Referring to FIG. 2B, photosensitive layer patterns 231 and 232 are formed on the first region 201 and the second region 202, respectively, where the photosensitive layer 230 is patterned using the halftone mask 300. The photosensitive layer pattern 231 formed on the first region 201 is formed to correspond to the blocking region 310 of the halftone mask 300 while the photosensitive layer pattern 232 formed on the second region 202 is formed to correspond to the semi-transmission region 320 of the halftone mask 300. Therefore, the photosensitive layer pattern 232 formed on the second region 202 has a relatively thinner thickness compared to the photosensitive layer pattern 231 formed on the first region 201.

Figure 2C:
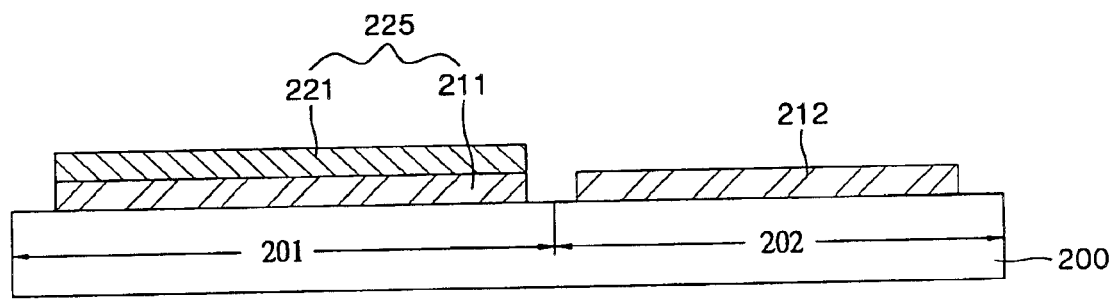

Referring to FIG. 2C, the black matrix 225 is formed on the first region 201 and the pixel electrode 212 is formed on the second region 202, at the same time, by masking the photosensitive layer patterns 231 and 232 having a different thickness, and etching the layer 220 having a concentration gradient and the transparent conductive layer 210. The black matrix 225 includes a transparent conductive pattern 211 and a pattern 221 having a concentration gradient. The black matrix 225 is formed on the first region 201 while the pixel electrode 212 having a transparent conductive pattern is formed on the second region 202 by a thickness difference between the photosensitive layer patterns 231 and 232.

The layer 220 having a concentration gradient for the black matrix 225 comprises a first component of transparent material and a second component of metallic material, and has a concentration gradient of a continuous gradient structure, a step gradient structure, or a multi-gradient structure.

Figure 4A:
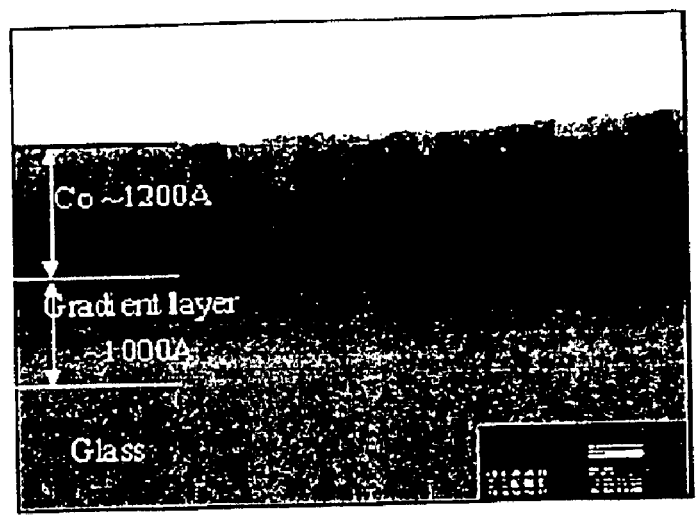
FIG. 4A to FIG. 4B are cross-sectional views illustrating a concentration gradient of a black matrix material in an organic electroluminescent display according to the present invention.
Figure 4B:
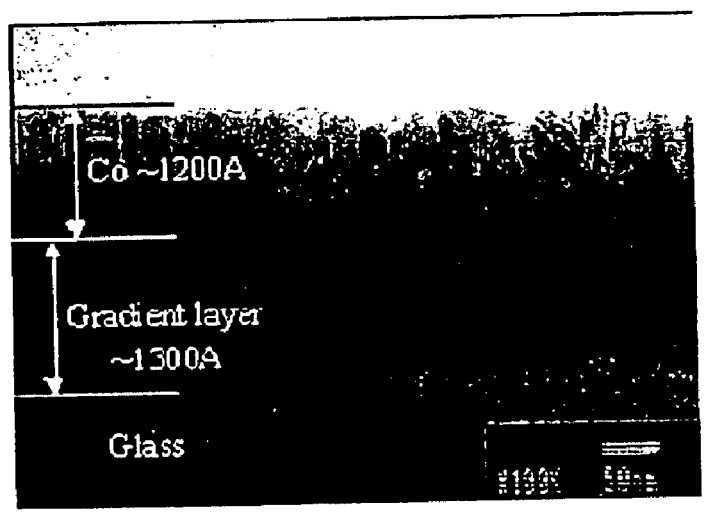

FIG. 4A and FIG. 4B illustrate cross-sectional views of concentration gradients of layers for the black matrix 225 according to the present invention. As illustrated in FIG. 4A, with reference to FIG. 2A to FIG. 2D, the layer 220 for the black matrix 225 has a concentration gradient of a continuous gradient structure in which a first component of transparent material is gradually decreased while a second component of metallic material is gradually increased as a thickness of the black matrix 225 is being increased from a surface of the substrate 200, that is, as a distance of external incidence light is becoming more distant.

On the other hand, as illustrated in FIG. 4B, with reference to FIG. 2A to FIG. 2D, the layer 220 for the black matrix 225 has a concentration gradient of a step gradient structure in which a first component of transparent material is decreased in steps while a second component of metallic material is increased in steps as a thickness of the black matrix 225 is being increased from the surface of the substrate 200, that is, as a distance of external incidence light is becoming more distant. The layer 220 for the black matrix 225 may have a step gradient structure in which the first and second components are decreased and increased in five steps.

Although not shown, the layer 220 for the black matrix 225 can have a concentration gradient of a multi-gradient structure in which the continuous gradient of FIG. 4A is repeatedly formed, a multi-gradient structure in which the step gradient of FIG. 4B is repeatedly formed, or a multi-gradient structure in which the continuous gradient and the step gradient are repeatedly formed.

A transparent dielectric material such as $SiO_2$ and $SiN_x$, or a transparent conductive material such as ITO, IZO and ZnO can be used as the first component of transparent material of the black matrix 225, and Al, Cr, Mo, Ti, Ag, Au, W, and Cu can be used as the second component(s) of metallic material of the black matrix 225.

In one aspect of the present invention, the pixel electrode material 210 and the layer 220 having a concentration gradient can be deposited in in-situ, in an operation of FIG. 2A, where a material having concentration gradients of a transparent conductive material and a metallic material for a pixel electrode is used as the layer 220 having a concentration gradient for the black matrix 225.

A black matrix having the foregoing structure prevents a reflection of external light since a light absorption ratio is increased as a thickness of the black matrix is increased from a surface of a substrate, that is, as a distance of external incidence light is more distant.

As described above, a fabrication method of the organic electroluminescent display can be simplified since a separate masking operation to form the black matrix 225 is excluded where the black matrix 225 including the transparent conductive pattern 211 and the pattern 221 having a concentration gradient, and the pixel electrode 212 having a transparent conductive pattern are simultaneously formed on the substrate 200 using the halftone mask 300.

Figure 2D:
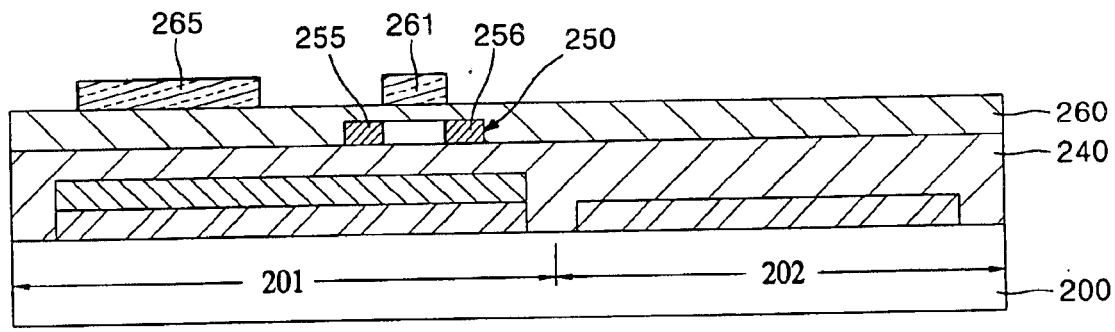
Figure 2E:
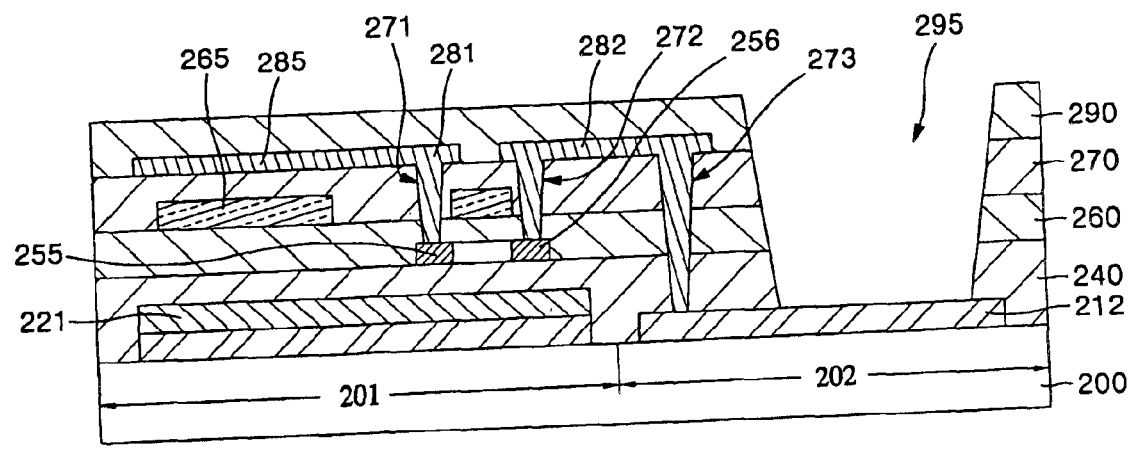

Referring to FIG. 2D and FIG. 2E, a thin film transistor, a capacitor and an organic electroluminescent display device are formed after the forming of the black matrix 225 and the pixel electrode 212. A buffer layer 240 is first formed on a front surface of the substrate 200 on which the black matrix 225 and the pixel electrode 212 are formed, and a semiconductor layer 250 is formed on the buffer layer 240 of the first region 201.

Subsequently, a gate insulating layer 260 is formed on the buffer layer 240 having the semiconductor layer 250, and a gate electrode 261 and a first electrode 265 of the capacitor are simultaneously formed on the gate insulating layer 260 of an upper part of the semiconductor layer 250. Source/drain regions 255 and 256 are formed, for example, by ion implanting certain conductive type impurities, for example, n type or p type impurities into the semiconductor layer 250 after the forming of the gate electrode 261 and the first electrode 265 of the capacitor.

Thereafter, as shown in FIG. 2E, contact holes 271, 272 and 273 which expose the source/drain regions 255 and 256, and the pixel electrode 212, are formed by forming an interlayer insulating layer 270 on the front surface of the substrate 200, and etching the interlayer insulating layer 270, the gate insulating layer 260 and the buffer layer 240.

A source electrode 281, which is electrically contacted with one of the source/drain regions, for example, a source region 255 through the contact hole 271, and a second electrode 285 of the capacitor, which is connected to the source electrode 281, are formed by patterning a metallic material after depositing the metallic material on the interlayer insulating layer 270 having the contact holes 271, 272 and 273. Furthermore, a drain electrode 282, which is electrically contacted with the drain region 256 through the contact hole 272 and electrically connected to the pixel electrode 212 through the contact hole 273, is formed.

An opening part 295 is formed by etching a passivation layer 290, the interlayer insulating layer 270, the gate insulating layer 260, and the buffer layer 240 so as to expose the pixel electrode 212 after the forming of the passivation layer 290 on the front surface of the substrate 200. Although not shown, a cathode is formed after forming an organic electroluminescent layer on the pixel electrode 212 in the opening part 295.

Figure 3:
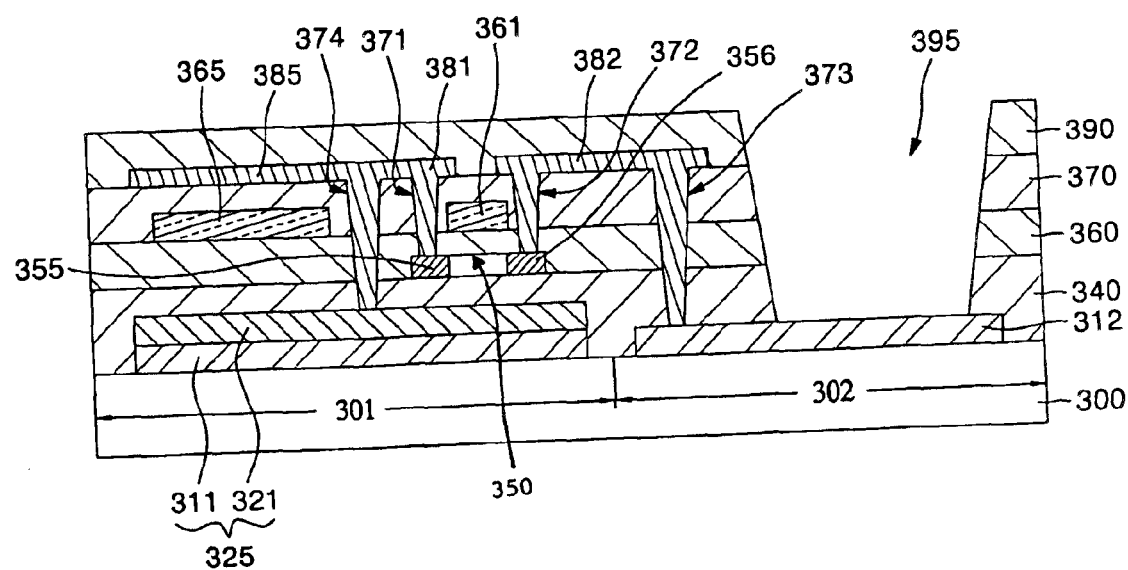
FIG. 3 is a cross-sectional view illustrating a method of fabricating an organic electroluminescent display according to another embodiment of the present invention.

FIG. 3 illustrates a cross-sectional view of an organic electroluminescent display, which is a flat panel display, according to another embodiment of the present invention. In this embodiment, a black matrix 325 is used as an electrode of a capacitor, and the black matrix 325 includes a transparent conductive pattern 311 and a pattern 321 having a concentration gradient. A pixel electrode 312 having a transparent conductive pattern and the black matrix 325 are formed on the same surface of a substrate 300, as in the embodiment shown in FIG. 2A to FIG. 2F.

That is, in this embodiment, a capacitor having a parallel structure along with a second electrode 365 and a third electrode 385 is formed by using the black matrix 325 as a first electrode of the capacitor.

A method of forming the black matrix 325, which includes the transparent conductive pattern 311 and the pattern 321 having a concentration gradient, and the pixel electrode 312 having a transparent conductive pattern on the dielectric substrate 300 is the same as that of the embodiment of FIG. 2A to FIG. 2E.

Thereafter, an interlayer insulating layer 370 is formed on a front surface of the substrate 300 after forming a semiconductor layer 350 equipped with source/drain regions 355 and 356 on a buffer layer 340, and forming a gate 361 and a second electrode 365 of the capacitor on a gate insulating layer 360.

Subsequently, the interlayer insulating layer 370 is etched to form first and second contact holes 371 and 372 which expose the source/drain regions 355 and 356, a third contact hole 373 which exposes the pixel electrode 312, and a fourth contact hole 374 which exposes the pattern 321 having a concentration gradient of the black matrix 325, at the same time.

A conductive material for source/drain electrodes 381 and 382 is deposited and patterned on the interlayer insulating layer 370 to form, for example, the source electrode 381, which is contacted with the source region 355 through the first contact hole 371, the drain electrode 382 which is simultaneously contacted with the drain region 356 through the second contact hole 372 and contacted with the pixel electrode 312 through the third contact hole 373, and a third electrode 385 of the capacitor which is simultaneously connected to the source electrode 381 and connected to the black matrix 325 through the fourth contact hole 374.

The black matrix 325 is conductive and used as a first electrode of the capacitor. Accordingly, a transparent conductive material such as ITO, IZO and ZnO can be used as a first component of the black matrix 325 while a metallic material such as Al, Cr, Mo, Ti, Ag, Au, W and Cu can be used as a second component of the black matrix 325.

According to the foregoing embodiments of the present invention, a separate masking operation to form a black matrix can be omitted since the black matrix and a pixel electrode can be simultaneously formed on the same surface of a substrate using a halftone mask using only one cycle of a masking operation. Additionally, a conventional insulating layer deposition operation to insulate the pixel electrode from source/drain electrodes can be omitted in the present invention. Also, a separate masking operation to form a via hole which connects the pixel electrode and the source/drain electrodes can be omitted in the present invention. Therefore, the foregoing embodiments of the present invention result in process simplification and yield improvement.

Furthermore, in a flat panel display having a black matrix and a fabrication method thereof according to the foregoing embodiments of the present invention, a luminance can be improved by preventing a reflection due to external light without using an expensive polarizer, thereby improving a transmittancy.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A flat panel display comprising:
    a substrate;
    a pixel electrode formed on the substrate;
    a black matrix having a plurality of layers and formed on the same surface as the pixel electrode;
    a first insulating layer formed on a front surface of the substrate;
    a thin film transistor formed on the first insulating layer corresponding to the black matrix so as to be connected to the pixel electrode;
    a capacitor formed over the first insulating layer corresponding to the black matrix so as to be connected to the thin film transistor; and
    a second insulating layer formed on the front surface of the substrate having an opening part which exposes a part of the pixel electrode.

2. The flat panel display according to claim 1, wherein the black matrix comprises a patterned layered structure of a pixel electrode material for the pixel electrode, and a black matrix material including a transparent material and a metallic material so as to form a pattern having a concentration gradient.

3. The flat panel display according to claim 2, wherein the pattern having a concentration gradient for the black matrix has a concentration gradient of a continuous gradient structure in which constituents of the transparent material are continuously decreased while constituents of the metallic material are continuously increased as a thickness of the black matrix is being increased, a step gradient structure in which the constituents of the transparent material are gradually decreased while the constituents of the metallic material are gradually increased as the thickness of the black matrix is being increased, or a multi-gradient structure in which the continuous gradient structure and/or the step gradient structure are repeated.

4. The flat panel display according to claim 1, wherein the black matrix is electrically connected to the capacitor so as to be used as an electrode of the capacitor.

5. The flat panel display according to claim 2, wherein the pixel electrode and the black matrix are structures which are simultaneously formed on the same surface by selectively removing the pixel electrode and black matrix materials.

6. The flat panel display according to claim 2, wherein the pixel electrode and the black matrix are structures which are formed using only one masking operation.

7. The flat panel display according to claim 2, wherein the metallic material includes at least one of Al, Cr, Mo, Ti, Ag, Au, W, and Cu.

8. The flat panel display according to claim 2, wherein the transparent material Is a transparent dielectric material.

9. The flat panel display according to claim 8, wherein the transparent dielectric material is one of $SiO_2$ and $SiN_x$.

10. The flat panel display according to claim 2, wherein the transparent material is a transparent conductive material.

11. The flat panel display according to claim 10, wherein the transparent conductive material is one of ITO, IZN, and ZnO.

* * * * *